United States Patent

Barret et al.

[11] Patent Number: 6,057,577
[45] Date of Patent: *May 2, 2000

[54] COMPONENT OF PROTECTION OF AN INTEGRATED MOS POWER TRANSISTOR AGAINST VOLTAGE GRADIENTS

[75] Inventors: Jean Barret, Eguilles; Antoine Pavlin, Puyricard; Pietro Fichera, Luynes, all of France

[73] Assignee: STMicroelectronics S.A., Gentilly, France

[*] Notice: This patent issued on a continued prosecution application filed under 37 CFR 1.53(d), and is subject to the twenty year patent term provisions of 35 U.S.C. 154(a)(2).

[21] Appl. No.: 09/085,521

[22] Filed: May 27, 1998

[30] Foreign Application Priority Data

May 28, 1997 [FR] France ..................... 97 06824

[51] Int. Cl.$^7$ .................. H01L 23/62; H01L 31/119; H01L 29/76
[52] U.S. Cl. .................. 257/355; 257/356; 257/357; 257/358; 257/359; 257/360; 257/904; 257/135; 257/213; 257/302; 257/329; 257/328; 361/56; 361/91; 361/111; 361/58
[58] Field of Search ..................... 257/355, 356, 257/358, 359, 360, 904, 135, 213, 302, 329, 328; 361/56, 91, 111, 58

[56] References Cited

U.S. PATENT DOCUMENTS

| 5,079,608 | 1/1992 | Wodarczyk et al. | 257/355 |
|---|---|---|---|
| 5,099,302 | 3/1992 | Pavlin | 357/42 |
| 5,212,618 | 5/1993 | O'Neill et al. | 257/356 |
| 5,623,387 | 4/1997 | Li et al. | 257/355 |

FOREIGN PATENT DOCUMENTS

| 0 359 680 B1 | 3/1990 | European Pat. Off. |
| 57183064 | 11/1982 | Japan. |

*Primary Examiner*—Carl Whitehead, Jr.
*Assistant Examiner*—Matthew Warren
*Attorney, Agent, or Firm*—Theodore E. Galanthay; Robert Iannucci; Seed IP Law Group

[57] ABSTRACT

The present invention relate to a device of protection against voltage gradients of a monolithic component including a vertical MOS power transistor and logic circuits. The protection circuit has an N-type substrate corresponding to the drain of the MOS transistor, and logic components being realized in at least one P-type well formed in the upper surface of the substrate. Each of the N-type regions connected to the ground of the logic circuit, or to a node of low impedance with respect to the ground, is in series with a resistor.

15 Claims, 2 Drawing Sheets

COMPONENT OF PROTECTION OF AN INTEGRATED MOS POWER TRANSISTOR AGAINST VOLTAGE GRADIENTS

TECHNICAL FIELD

The present invention relates to components associating in a same substrate vertical diffused-type MOS power transistors (VDMOS) and logic circuits. More specifically, the invention relates to protection circuits for circuits having both VDMOS transistors and logic circuits.

BACKGROUND OF THE INVENTION

FIG. 1 schematically shows a portion of a component combining a VDMOS transistor and a logic circuit. This component includes an N-type substrate generally formed of an N-type epitaxied layer 1 formed on an $N^+$-type substrate 2. A power transistor is formed in the right-hand portion and a logic well is formed in the left-hand portion.

The power transistor includes a set of identical cells connected to one another, such as cell 3. Each cell includes a P-type well 4, the central portion 5 of which is more heavily doped. An N-type ring 6 is formed in the upper portion of the well. The portion separating the external periphery of the N-type ring from the external periphery of the P-type well is coated with an insulated gate 8. The N-type ring 6, as well as central portion 5 of the well are coated with a metallization 9. All gates 8 are connected to a gate terminal G and all metallizations 9 are connected to a source terminal S. The rear surface of the structure is coated with a drain metallization D. Thus, when a gate signal is applied, a current is likely to flow from terminal D to terminal S. More specifically, the current likely flows from N regions 1 and 2 to N region 6, via a channel formed under the insulated gates. This structure is generally used so that the drain is biased at a positive potential with respect to the source.

Although identical "cells" have been mentioned hereabove, the power transistor can have a digited structure. Regions 6 are then not "rings". This vocabulary will however be kept hereafter to simplify the discussion.

Logic circuits are formed in one or several wells 10. An elementary MOS transistor having drain, source, and gate terminals d, s, and g has been shown in the well 10. This is only an example of component likely to be formed in a logic well.

In some applications, for example in switched mode power supplies, a high voltage gradient is likely to appear between the drain and the source of the MOS power transistor during a phase of switching to the off state.

FIG. 2 shows an example of a switched-mode power supply circuit. An input voltage $V_{IN}$ is applied to a primary 20 of a transformer, a secondary 21 of which is connected to a capacitor 22 via a diode 23. An output voltage $V_{OUT}$ is available across capacitor 22. The second terminal of primary 20 is connected to the supply ground via an integrated component 25 including a vertical MOS power transistor TP and a logic circuit 27. This logic circuit includes a terminal connected to the drain terminal of the power transistor, corresponding to the rear surface of the component of FIG. 1, a terminal connected to the ground and at least one input terminal 28 receiving control signals. This logic circuit 27 is especially meant for controlling the gate of the power transistor.

The operation of a switched-mode power supply is well known by those skilled in the art. It consists of periodically switching power transistor TP. Upon each switching to the off-state of power transistor TP, there is a high power-up, which is effectively desired to be as quick as possible. Even if no parasitic component intervenes and the voltage across power transistor TP does not exceed the normal maximum voltage of the circuit, integrated components of the type of that in FIG. 1 appear to be damaged under certain circumstances. This phenomenon is not explained a priori and it is the contribution of the present invention to have analyzed this phenomenon, to have found its cause, and to have brought a remedy thereto.

SUMMARY OF THE INVENTION

Thus, the present invention provides a protection device against voltage gradients of a monolithic component including a vertical MOS power transistor (VDMOS) and logic circuits. The substrate of the component has a first type of conductivity and corresponds to the drain of the MOS transistor. The logic components are formed in at least one well of the second type of conductivity formed in the upper surface of the substrate. Each of the regions of the first type of conductivity connected to the ground of the logic circuit, or connected to a node of low impedance with respect to the ground, is in series with a resistor.

According to an embodiment of the present invention, the terminal of the resistor which is not connected to said region is connected to a contact on the well, which in turn is connected to the ground.

According to an embodiment of the present invention, the resistor corresponds to a polysilicon region formed on an oxide layer, which, according to an embodiment of the present invention, is a thick oxide layer.

The foregoing objects, features and advantages of the present invention will be discussed in detail in the following non-limiting description of specific embodiments in connection with the accompanying drawings.

DETAILED DESCRIPTION OF THE INVENTION

In the various drawings, same elements are referred to with same references. Further, in the various cross-sectional views of semiconductor components, as is usual, the various dimensions are not drawn to scale but are arbitrarily expanded to facilitate the readability of the drawings.

Figure 1:
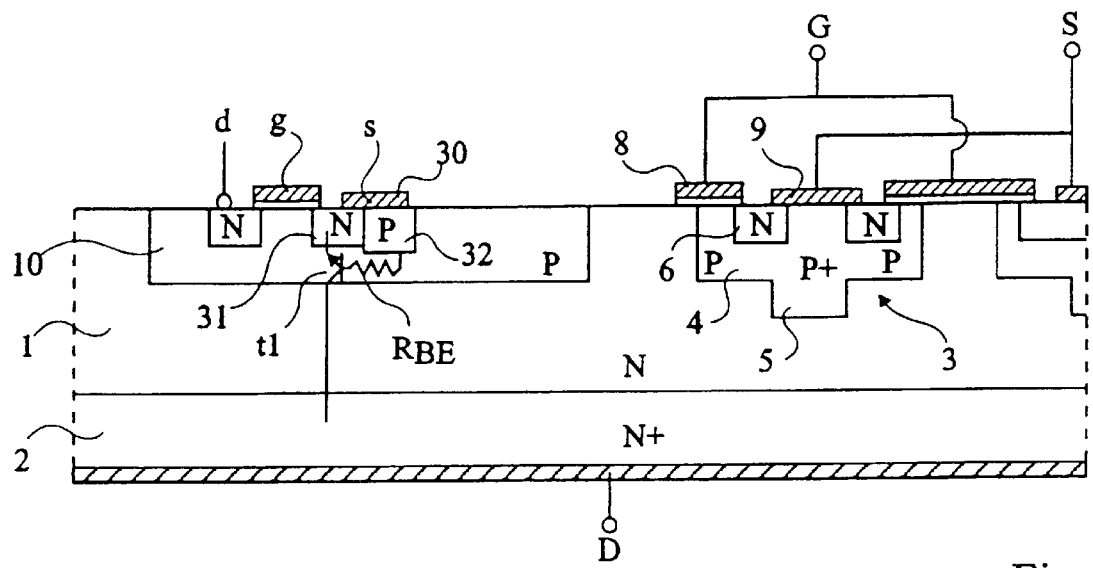
FIG. 1 is a simplified partial cross-sectional view of a component including a vertical MOS transistor and logic circuits.
Figure 2:
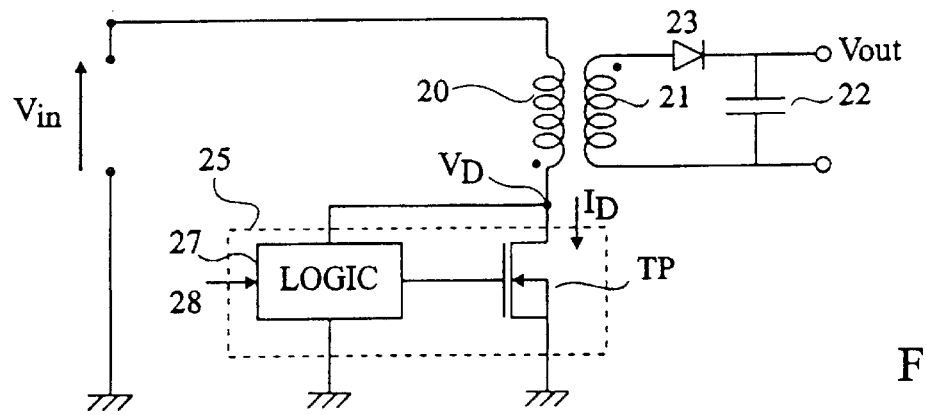
FIG. 2 shows an example of use of the component of FIG. 1.

Logic well 10 shown in FIG. 1 includes an MOS transistor, the source of which is connected to the ground. Further, well 10 is generally grounded and there is a metallization 30 connecting N-type source region 31 to over-doped P-type region 32 used as a contacting area with well 10, the assembly to be grounded. More than 1 MOS transistor may be formed in the logic well 10.

Figure 3:
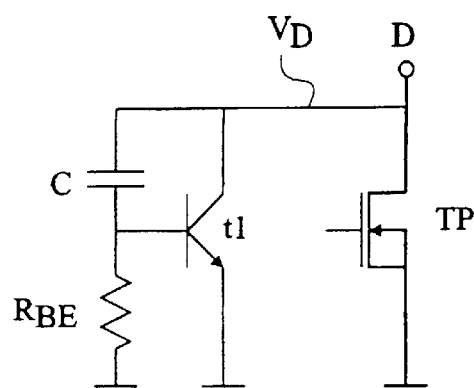
FIG. 3 shows an equivalent diagram of elements of the circuit of FIG. 1.

As shown in FIG. 3, there thus exist, in parallel with power transistor TP, parasitic transistor t1, the collector of which corresponds to the drain terminal of power transistor TP, the emitter of which corresponds to the N-type region 31 and the base of which corresponds to the P-type region 32. Like in any transistor, there is a base resistance, shown as resistor $R_{BE}$ between the base and the emitter. Similarly, like in any transistor, there is a stray capacitance, shown as a capacitor C between the collector and the base. Thus, when drain voltage VD increases rapidly, capacitor C may be considered as a short-circuit and a current will flow through resistor $R_{BE}$ which, when exceeding a certain threshold, turns on transistor t1. Transistor t1 being of small dimension, it is most likely to be destroyed as it turns on when the collector voltage VD is very high (close to its avalanche voltage).

To solve this problem, and to avoid the triggering of transistors t1, the present inventors have first tried to reduce as much as possible base-emitter resistance $R_{BE}$ by optimizing the doping level of the several elements and the shapes of the emitter-base digits of the considered transistors. However, this solution has not solved the problem, and breakdowns of monolithic structures associating vertical MOS power transistors and logic circuits realized in a logic well have still been acknowledged, in case of an abrupt rise of the voltage on the drain terminal (high voltage gradient dV/dt).

To solve this problem, the applicant modifies elements in the logic circuit having a terminal connected to the well potential and to the ground by adding an insulated resistive element between the region on which a contact is desired to be established, and the contact itself.

Figure 4:
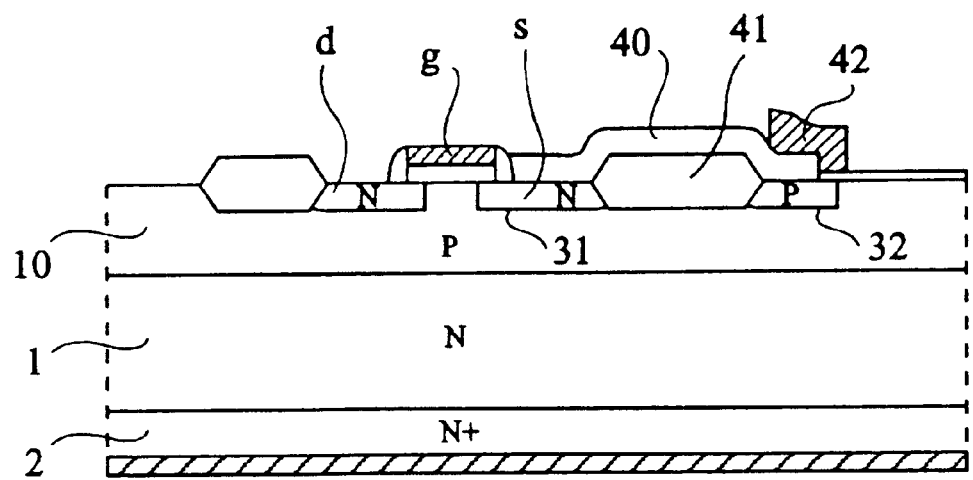
FIG. 4 shows a partial cross-sectional view of logic components modified according to the present invention.

FIG. 4 shows an example of embodiment of the present invention. In this drawing, a MOS transistor formed in well 10 has been shown. This transistor includes N-type drain and source regions separated by an area of the substrate topped with an insulated gate g. The source region is designated by reference 31 and a well contacting region is designated by reference 32. The connection between regions 31 and 32 is through a portion of resistive layer 40, disposed, for example, above a thick oxide region 41 separating regions 31 and 32. Layer 40 is, for example, made of polysilicon adequately doped to have a resistance on the order of 10 to 100 ohms between its contacting areas regions 31 and 32. Then, the contact with region 32 is performed conventionally, for example, by a contact metallization 42. Metallization 42 is arranged on layer 40 at a location distant from the contacting area with region 31, to incorporate between contact 42 and region 31 a resistor of determined value.

Figure 5:
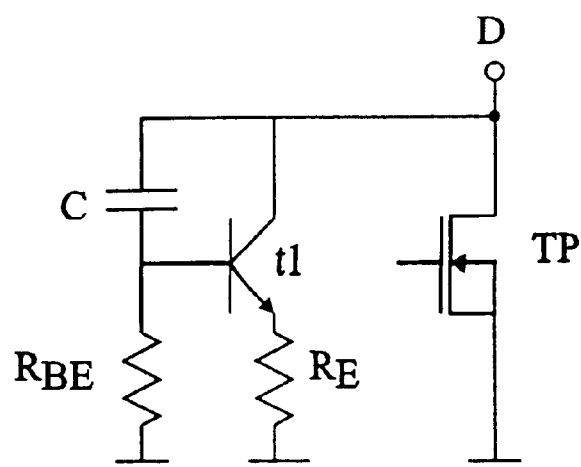
FIG. 5 shows an equivalent diagram of a structure including components modified according to the present invention.

The equivalent diagram of the modified structure according to the present invention is illustrated in FIG. 5. It can be seen that layer 40 corresponds to an emitter resistor $R_E$.

Of course, various alterations, modifications, and improvements of this emitter resistor $R_E$ will occur to those skilled in the art. It could for example be a metallization layer, sufficiently long to be resistive. A layer of resistive material could also be formed on oxide 41, a first metallization connecting the surface of region 31 to a first side of the resistive material and a second metallization connecting the surface of region 32 to a second side of the resistive material.

Further, as an alternative, the second terminal of the resistor (that which is not connected to the source) is not connected to region 32 and to the ground, but rather to a node of the circuit of low impedance with respect to the ground.

Thus, when a fast voltage increase appears on drain terminal D, as previously, a current flows through resistor $R_{BE}$ through capacitor C, which then substantially corresponds to a short-circuit. However, the triggering threshold of transistor t1 becomes higher due to the presence of resistor $R_E$ and then, even if this transistor turns on, the current flowing therethrough will be limited by the presence of resistor $R_E$. Thus, the invention protects transistor t1 by limiting the flow of current flowing therethrough.

In a preferred embodiment, the value of resistance $R_E$ is chosen so that, in normal operation, the voltage drop therein is almost negligible, for example, lower than 100 mV, in order not to reduce the performances of the logic circuits.

The invention is to be broadly interpreted and alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

We claim:

1. A device for protection against voltage gradients of a monolithic component including a vertical MOS power transistor (VDMOS) having a first conductivity type drain, the protection device comprising:
   a substrate of the first type of conductivity;
   the power transistor being realized in at least one well of a second type of conductivity formed in an upper surface of the substrate; and
   a resistor coupled in series between the drain and a ground of the logic circuit.

2. The device of claim 1, wherein a terminal of the resistor which is not connected to said drain is connected to a contact on the well, which in turn is connected to the ground.

3. The device of claim 1, wherein the resistor corresponds to a polysilicon region formed on an oxide layer.

4. The device of claim 3, wherein the oxide layer is a thick oxide layer.

5. In an integrated circuit including a power transistor and including other components, a protection device comprising:
   a substrate having a first doping type and first and second surfaces, the second surface of the substrate coupled to the power transistor;
   a well of a second doping type formed in the substrate at the first surface thereof, at least one of the components located in the well;
   a well contact in the well, the well contact coupling the well to a reference voltage; and
   a resistor coupled between the well contact and the at least one component formed in the well.

6. The protection device of claim 5 wherein the resistor is formed of a polysilicon layer.

7. The protection device of claim 5 wherein the resistor is formed of a metal layer.

8. The protection device of claim 6 wherein the polysilicon layer is formed on an oxide layer.

9. The protection device of claim 5 wherein the resistor has a resistance of 10:100 ohms.

10. The protection device of claim 5, further including a metal component contact coupled to the at least one component and a metal well contact coupled to the well contact, wherein the resistor is coupled between the metal contacts.

11. The protection device of claim 5 wherein the resistor has first and second sides and wherein the at least one component is coupled to the first side of the resistor and the well contact is coupled to the second side of the resistor.

12. The protection device of claim 5 wherein the resistor is coupled to a portion of the at least one component that is, in turn, coupled to the reference voltage and is not coupled to the well contact.

13. The protection device of clam 5 wherein the at least one component is a source of an MOS transistor.

14. The protection device of claim 5 wherein the at least one component is a portion of a parasitic transistor coupled in parallel to the power transistor.

15. The protection device of claim 5 wherein the reference voltage is a ground voltage.

* * * * *